(12) United States Patent
Fujita et al.

(10) Patent No.: US 6,522,143 B1
(45) Date of Patent: Feb. 18, 2003

(54) BIRDCAGE RF COIL EMPLOYING AN END RING RESONANCE MODE FOR QUADRATURE OPERATION IN MAGNETIC RESONANCE IMAGING

(75) Inventors: Hiroyuki Fujita, Highland Heights, OH (US); William O. Braum, Twinsburg, OH (US)

(73) Assignee: Koninklijke Philips Electronics, N. V., Eindhoven (NL)

( * ) Notice: Subject to any disclaimer, the term of this patent is extended or adjusted under 35 U.S.C. 154(b) by 0 days.

(21) Appl. No.: 09/398,650

(22) Filed: Sep. 17, 1999

(51) Int. Cl.$^7$ .................................................. G01V 3/00
(52) U.S. Cl. ...................................... 324/318; 324/322
(58) Field of Search .............................. 324/318, 322, 324/307, 309

(56) References Cited

U.S. PATENT DOCUMENTS

| | | | |
|---|---|---|---|
| 4,680,548 A | | 7/1987 | Edelstein et al. ............ 324/318 |
| 5,347,220 A | * | 9/1994 | Van Heelsbergen ......... 324/318 |
| 5,990,681 A | * | 11/1999 | Richard et al. .............. 324/318 |
| 6,316,941 B1 | * | 11/2001 | Fujita et al. ................. 324/318 |

OTHER PUBLICATIONS

"An Efficient, Highly Homogeneous Radiofrequency Coil for Whole–Body NMR Imaging at 1.5 T" by Cecil E. Hayes, et al.
Journal of Magnetic Resonance 63, 622–628 (1985). Copyright 1985 by Academic Press, Inc.

Dept. Of Electrical and Computer Engineering, Univ. Of Ill. At Urbana–Champaign, Urbana, IL. Copyright 1999 by CRC Press LLC.
"The Theory of the Bird–Cage Resonator" by James Tropp. Journal of Magnetic Resonance 82,51–62(1989). Copyright 1989 by Academic Press, Inc.
"Electromagnetic Analysis and Design in Magnetic Resonance Imaging" by Jianming Jin.

* cited by examiner

*Primary Examiner*—Edward Lefkowitz
*Assistant Examiner*—Dixomara Vargas
(74) *Attorney, Agent, or Firm*—Fay, Sharpe, Fagan, Minnich & McKee, LLP

(57) ABSTRACT

A magnetic resonance apparatus includes a main magnetic field source (12) for providing a magnetic field ($B_0$) along a main field axis. A transmitter (34) and transmit coils (30, 32) excite a nuclei of an object to resonate. The resonating nuclei generate magnetic resonance signals detected by a volume coil (50) including a pair of end rings (70, 72) separated along a coil axis (Y). The end rings (70, 72) are electrically interconnected by a plurality of rungs (74) disposed about the rings. A conductive loop (80) is concentrically disposed between and inductively coupled to the end rings. The loop includes an electrical conductor (82) preferably surrounding the rungs (74), and positioned parallel to the end rings (70, 72). A capacitive element (84), in electrical communication with the conductor (82), is selected or adjusted to tune the loop (80) to signals at a selected frequency. Moreover, the loop (80) is slidably positionable along the coil axis (Y) and has an adjustable capacitor (84) to match or tune the loop to signals at the selected frequency.

25 Claims, 3 Drawing Sheets

BIRDCAGE RF COIL EMPLOYING AN END RING RESONANCE MODE FOR QUADRATURE OPERATION IN MAGNETIC RESONANCE IMAGING

BACKGROUND OF THE INVENTION

The present invention relates to the magnetic resonance arts. It finds particular application in conjunction with medical diagnostic imaging and will be described with reference thereto. It is to be appreciated, however, that the invention may find further application in quality control inspections, spectroscopy, and the like.

Magnetic resonance imaging (MRI) machines operate by applying a main magnetic field through an examination region to align the nuclei of a subject. This main magnetic field, typically denoted $B_0$, is horizontal in some MRI systems and vertically oriented in others.

In both horizontal and vertically oriented MRI systems, a magnetic resonance is excited in the aligned nuclei by an orthogonal RF field $B_1$ causing them to emit RF resonance signals. This resonance is detected by a radio frequency (RF) coil that is tuned to the resonance frequency. The signals received by the coil depict the three dimensional spatial distribution and other characteristics of the resonating nuclei. Of the many RF coil configurations, birdcage type coils are commonly used for head and whole body imaging.

Birdcage coils are used widely for many applications, especially in horizontal $B_0$ MRI systems where it is convenient to align the axis of the coil with the $B_0$ field and there is good $B_1$ field uniformity over large fields of view. For most applications, birdcage coils are used on a quadrature mode. Typically, these quadrature birdcage coils are disposed axially in horizontal $B_0$ MRI machines such that the coil has orthogonal $B_1$ modes perpendicular in the $B_0$ field. In other words, the coil axis is parallel to the $B_0$ main magnetic field axis. Accordingly, the $B_1$ fields most useful in such a coil are those, preferably, orthogonally disposed to the $B_0$ axis.

Quadrature birdcage type coils can also be used in a vertically oriented $B_0$ MRI machine. However, when the birdcage coil is oriented with its axis horizontal, the quadrature capability of the coil fails or gets degraded as some of the $B_1$ components in the legs or rungs of the coil are parallel to the vertical $B_0$ direction. Accordingly, other types of quadrature coils are typically used in vertical $B_0$ machines, and in other cases where the $B_0$ field is not parallel with the axis of the coil.

The present invention contemplates a new, improved birdcage coil supporting three axis modes providing quadrature reception irrespective of $B_0$ field direction. The present invention thus, overcomes the above difficulties and others.

BRIEF SUMMARY OF THE INVENTION

In accordance with the present invention, a magnetic resonance method in which a magnetic field is generated along an axis through an examination region is shown. Radio frequency signals are transmitted into the examination region to induce magnetic resonance in nuclei of a desired object. The induced magnetic resonance is received by a birdcage or volume coil and is processed into an image representation. The method includes extracting an end ring resonant mode signal from the volume coil.

In accordance with another aspect of the present invention, the extracting step includes inductively coupling a loop to the end ring resonant mode signal.

In accordance with another aspect of the present invention, a magnetic resonance apparatus includes a main magnetic field generator for providing a main magnetic field along an axis. A magnetic resonance exciter excites nuclei of an object to resonate, which generates magnetic resonance signals. A volume coil is also provided, which includes a pair of end rings separated along a coil axis. The end rings are electrically interconnected by a plurality of rungs disposed about a periphery of the end rings. A conductive element, also provided, inductively couples to the end rings.

In accordance with another aspect of the present invention, a volume radio frequency coil for use in a magnetic resonance apparatus includes a main magnetic field generator for providing a magnetic field along a axis. A radio frequency transmitter and a radio frequency receiver are also provided at least one of which is connected with the RF coil. The RF coil includes a pair of conductive end rings disposed concentrically about a coil axis in parallel planes. A plurality of conductive rungs disposed about a periphery of the end rings provide electrical interconnection therebetween. An electrically conductive loop is also provided to inductive couple to the pair of end rings.

One advantage of the present invention resides in implementation of a conventional sinusoidal or cosinusoidal resonant mode and an end-ring resonant mode at the same frequency to provide three axis capability.

Another advantage of the present invention resides in the provision of quadrature reception and/or excitation anywhere in the imaging region, regardless of $B_0$ orientation.

Yet another advantage of the present invention resides in a full volume RF coil offering good $B_1$ uniformity regardless of $B_0$ alignment.

Still another advantage of the present invention resides in the ability to extract three orthogonal modes from a volume RF coil.

Other benefits and advantages of the present invention will become apparent to those skilled in the art upon a reading and understanding of the preferred embodiment.

BRIEF DESCRIPTION OF THE DRAWINGS

The invention may take physical form in certain parts and arrangements of parts and in various steps and arrangements of steps. The drawings are only for purposes of illustrating the preferred embodiments and are not to be construed as limiting the invention.

DETAILED DESCRIPTION OF THE PREFERRED EMBODIMENTS

Figure 1:
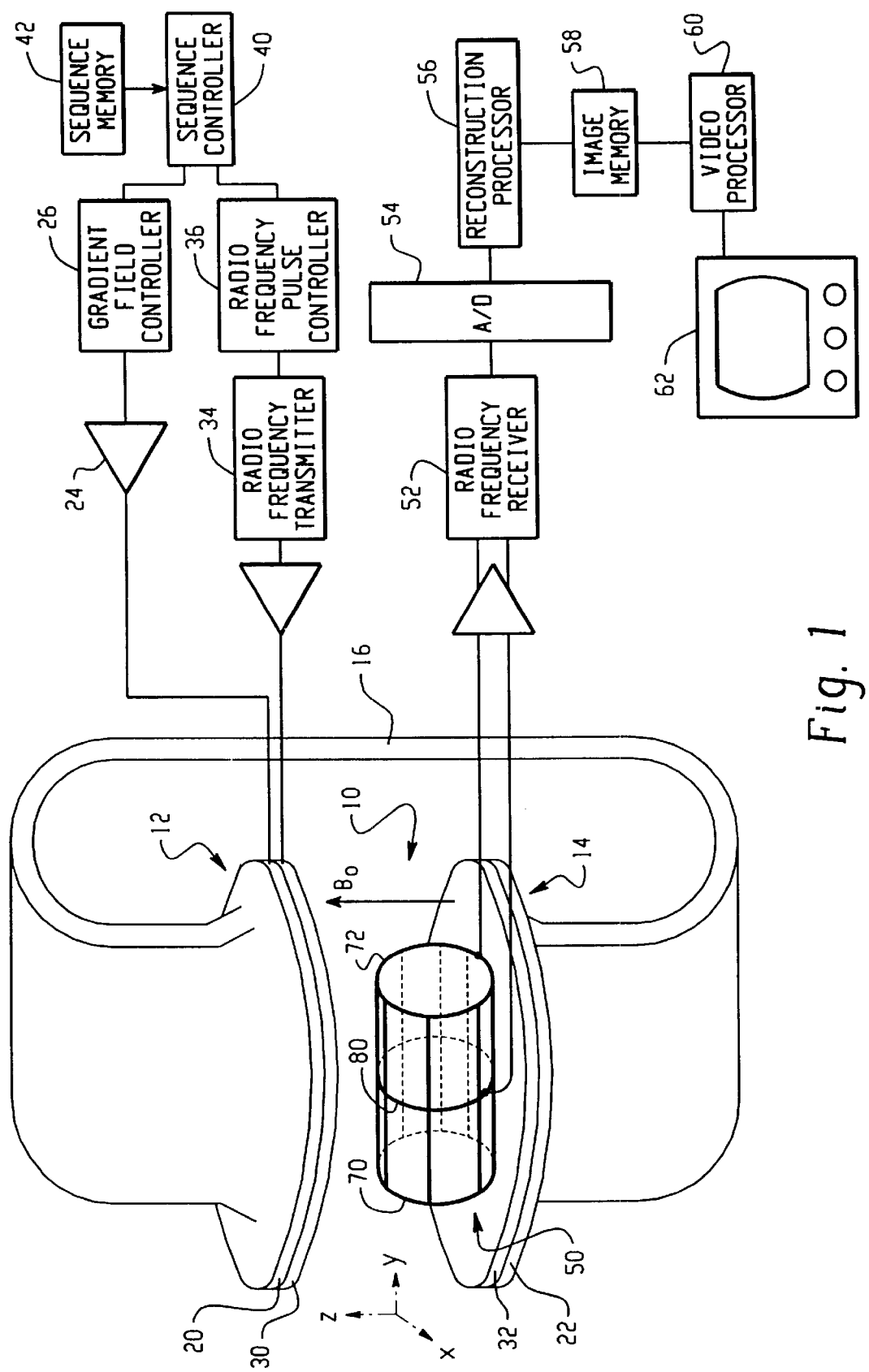
FIG. 1 is a diagrammatic illustration of a magnetic resonance imaging apparatus in accordance with the present invention.

With reference to FIG. 1, in a vertically oriented MRI system, an imaging region 10 is defined between pole pieces 12, 14. The pole pieces are preferably interconnected by a ferrous flux path 16, such as a C or U-shaped iron element, multiple ferrous posts, wall panels, or the like. In one preferred embodiment, the iron element 16 is a permanent magnet which causes a vertical $B_0$ magnetic field between the pole faces across the imaging region. In another preferred embodiment, electrical, preferably superconducting, windings induce the magnetic flux in the ferrous flux path 16 and the $B_0$ field across the pole faces. In another embodiment, the magnet is disposed adjacent one or both poles with no ferrous return path. Passive or active shims are disposed at the pole pieces to render the vertical $B_0$ field more linear across the imaging region 10.

For imaging, magnetic field gradient coils 20, 22 are disposed at the pole pieces 12, 14. In the preferred embodiment, the gradient coils are planar coil constructions which are connected by gradient amplifiers 24 to a gradient magnetic field controller 26. The gradient magnetic field controller, as is known in the art, causes current pulses which are applied to the gradient coils such that the gradients in the uniform magnetic field are created along the longitudinal or y-axis, the vertical or z-axis, and the transverse or x-axis.

In order to excite magnetic resonance in dipoles of a subject disposed in the examination region 10, radio frequency coils 30, 32 are disposed between the gradient coils and the imaging region. A radio frequency transmitter 34, preferably a digital transmitter, causes the radio frequency coils to transmit radio frequency pulses requested by a radio frequency pulse controller 36 to be transmitted into the imaging region 10. A sequence controller 40, under operator control, retrieves an imaging sequence from a sequence memory 42. The sequence controller 40 provides the sequence information to the gradient controller 26 and the radio frequency pulse controller 36 such that radio frequency and gradient magnetic field pulses in accordance with the selected sequence are generated.

A radio frequency birdcage coil assembly 50 is disposed along a region of interest in the imaging region 10. Those skilled in the art will recognize that longitudinal axis Y of the coil 50 is not parallel with the $B_0$ field which, previously, would interfere with quadrature performance of the coil. Typically, the radio frequency coils 30, 32 are general purpose coils and are built-in to provide excitation of nuclei in the imaging region 10 and are suitable for receiving resonance signals. The birdcage coil assembly 50, sensitized as discussed more fully below, senses desired signals and communicates the signals to a radio frequency receiver 52, preferably a digital receiver. The receiver 52 demodulates the radio frequency resonance signals received. Signals from an analog receiver are digitized with an analog-to-digital converter 54. The digitized signals are processed by a reconstruction processor 56 into volumetric or other image representations which are stored in a volumetric image memory 58. A video processor 60, under operator control, withdraws selected image data from the volume memory and formats it into appropriate format for display on a human-readable display 62, such as a video monitor, active-matrix monitor, liquid crystal display, or the like.

Figure 2:
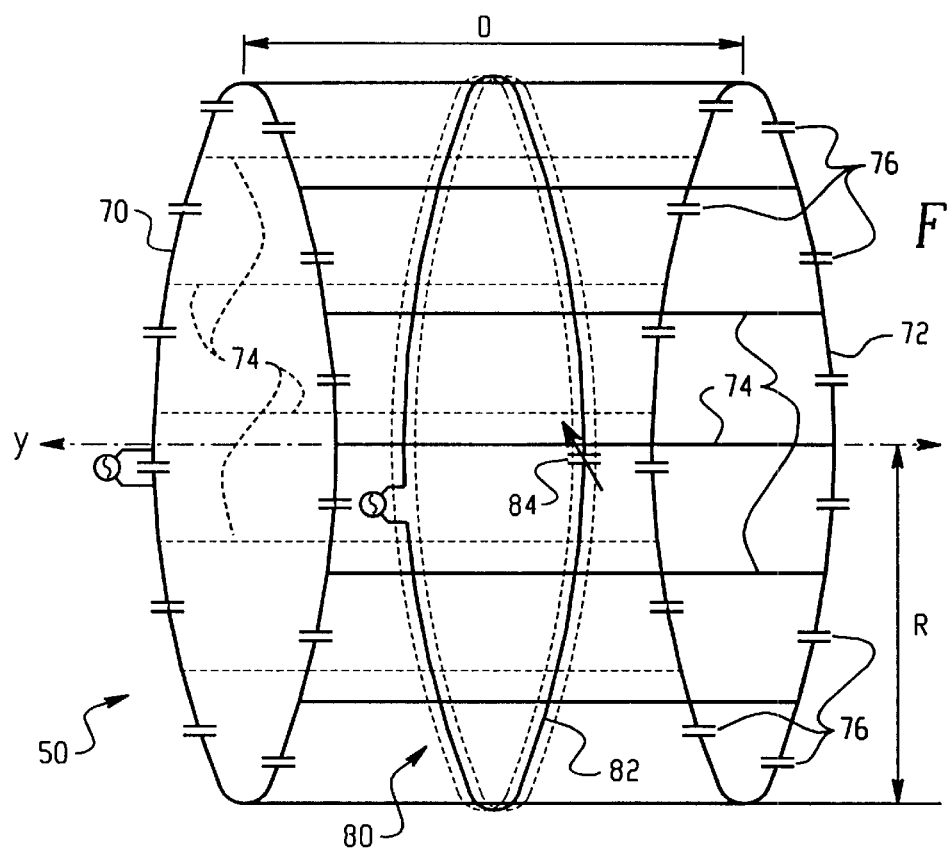
FIG. 2 is an enlarged view of the birdcage coil assembly of FIG. 1.

With reference to FIG. 2, the birdcage coil 50 includes a pair of end rings 70, 72 in a substantially parallel configuration. A plurality of legs or rungs 74 electrically interconnect the end rings 70, 72. Although the illustrated embodiment shows twelve legs, it is to be appreciated that a larger or smaller number of legs may also be employed. The end rings 70, 72 are preferably equal in size, defining a radius R, and separated by a distance D. Those skilled in the art can appreciate that the end rings 70, 72 can be viewed as a pair of Helmholtz coils which can be sensitized to a magnetic field, $B_1$, induced along the longitudinal axis Y of the coil. Moreover, artisans will recall from static electromagnetism, that a Helmholtz pair has optimized uniformity over a center region when the radius R of the loops are equal to the distance D separating them. However, the signals remain effectively detectable with other geometries.

As is generally known in the art, the legs or rungs 74 are also sensitive to $B_1$ fields orthogonal to the axis Y of the coil. In other words, the legs are sensitive to a pair of $B_1$ fields which are orthogonal to the $B_1$ field of the end-ring mode. Accordingly, when the end-ring mode and a conventional sinusoidal/co-sinusoidal resonant mode are tuned to the same frequency, three axis performance is achieved.

Capacitive elements 76 are provided in the birdcage coil 50 to tune the conventional sinusoidal/co-sinusoidal resonant modes as is generally known in the art. Moreover, while the capacitive elements 76 are illustrated in the end rings 70, 72, those skilled in the art will recognize that capacitive elements 76 may be alternatively or conjunctively located in the rungs 74 depending on desired lowpass, bandpass, or highpass operation.

Tuning of the end-ring mode is not so straight-forward, however. In order to tune the end ring mode to typical frequencies, preferably an electrically conductive loop 80 is inductively coupled to the end rings 70, 72. The loop 80 includes a conductive member 82 preferably surrounding the interconnecting rungs 74. The loop 80 is tuned or matched to the desired frequency by sliding the loop 80 longitudinally along the axis Y of the coil until coupling which substantially produces the desired resonance frequency. Additionally, a capacitive element 84 in the loop 80 is selected or adjusted to achieve sensitivity to the desired frequency. Those skilled in the art will further appreciate that the loop 80 may also be tuned and matched to the desired frequency by varying a width of conductive member 82. In other words, making the conductive member 82 either wider or thinner also assists in tuning the conductive loop 80.

Figure 3:
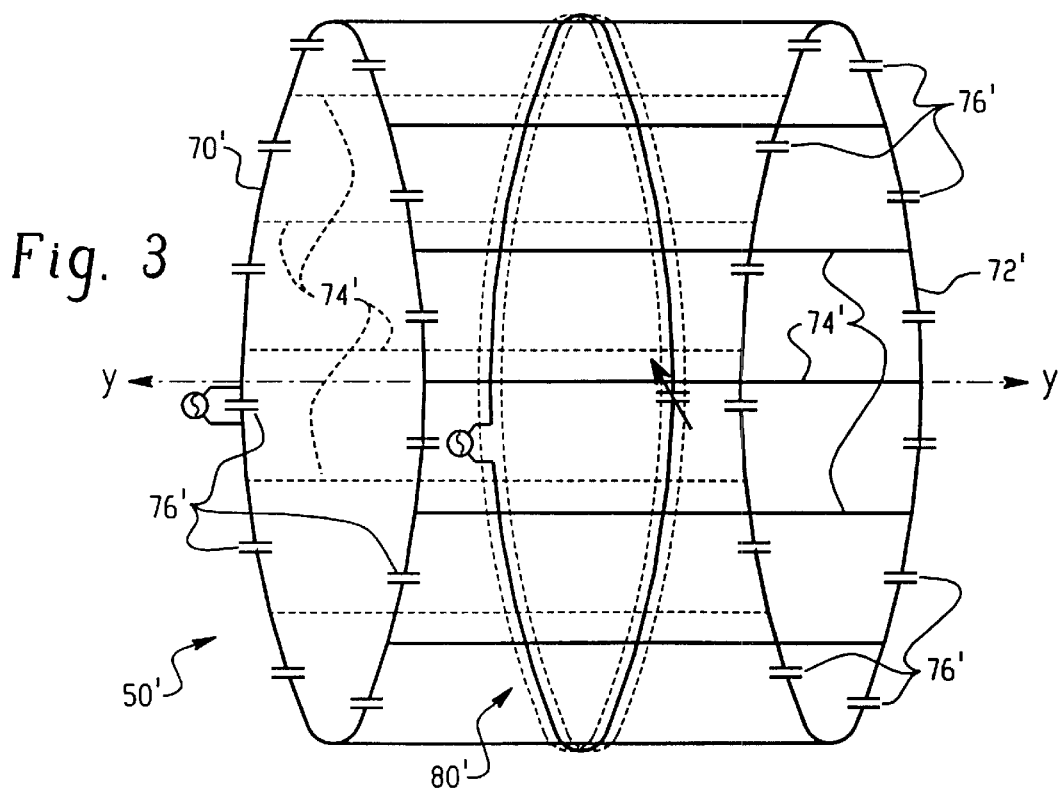
FIG. 3 is an exemplary birdcage coil in accordance with the present invention.

In the embodiment of FIG. 3, an illustrative birdcage coil 50' includes twelve rungs 74'. For 42.3 MHZ highpass frequency operation (i.e. hydrogen dipoles in 1 Tesla $B_0$ field), capacitive elements 76' are disposed in each end ring 70', 72'. Tuning of a sinusoidal/cosinusoidal resonant mode to a target imaging frequency is accomplished by adjusting or selecting the capacitive elements 76' e.g. a 180.6 pF capacitor. The exemplary inductive loop 80' has a 30 cm diameter and is parallel to the end rings 70', 72'. As discussed above, the loop 80' couples inductively with the end-ring resonant mode as it generates (or receives) a highly uniform $B_1$ field parallel to the axis Y of the birdcage coil. By adjusting the position of the loop 80' and changing a variable capacitance of the loop 80', both tuning and matching are accomplished.

Figure 4:
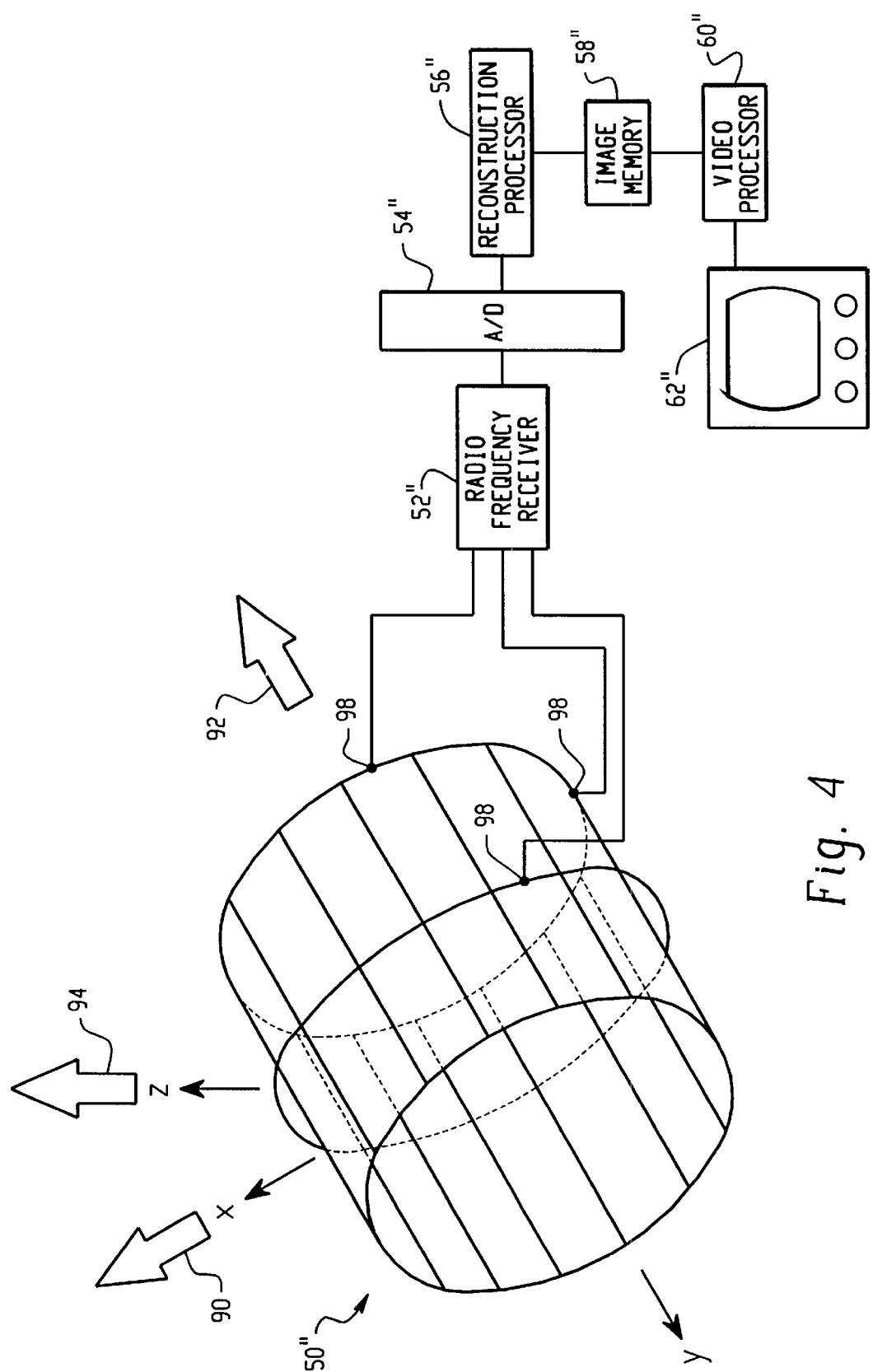
FIG. 4 is a simplified MRI system for detecting three orthogonal resonance modes.

It can now be appreciated by those skilled in the art, that three-axis performance is achievable by such a configured birdcage coil. Reference to FIG. 4 shows a simplified birdcage coil 50" and three orthogonal $B_1$ fields 90, 92, 94. The three detectable $B_1$ fields 90, 92, 94 are frequency matched as discussed above and signals associated with each are communicated to a receiver 52" through sampling ports 98. The coil 50" can be positioned with an arbitrary orientation in an MR scanner. Of course, the $B_1$ components that are aligned with the $B_0$ field will be obscured. Three axis reconstruction algorithms are applied to each of the signals in reconstruction processor 56" and stored and viewed as discussed above.

Artisans will appreciate that the availability of three resonant modes enables operators to place the coil as desired, irrespective of $B_0$ field direction. Moreover, it is to be appreciated that the coil may operate with two of the orthogonal modes tuned to the same frequency, while the third mode may be sampled for spectroscopy purposes at a different frequency. Similarly, all three detectable modes may be tuned to discreet frequencies in a three dipole spectroscopy environment.

Those skilled in the art can appreciate that while the above discussion focused principally on a vertically oriented MR system, the principles discussed herein are equally applicable to other MR imaging and spectroscopy systems where axial alignment of the coil within the $B_0$ field is not preferable or achievable.

The invention has been described with reference to the preferred embodiment. Modifications and alterations will occur to other upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance method in which a magnetic field is generated along a main field axis through an examination region, radio frequency signals are transmitted into the examination region to induce magnetic resonance in nuclei of an imaged object, the induced magnetic resonance is received by a volume coil having a pair of end rings disposed in parallel planes orthogonal to a longitudinal axis of the volume coil and processed into an image representation, the method comprising:

extracting an end ring resonant mode signal associated with an axial component of the induced resonance along the longitudinal axis from the volume coil.

2. A magnetic resonance method in which a magnetic field is generated along an axis through an examination region, radio frequency signals are transmitted into the examination region to induce magnetic resonance in nuclei of an imaged object, the induced magnetic resonance is received by a volume coil, the method comprising:

positioning the volume coil within the examination region, with a longitudinal axis of the coil offset from the axis of the magnetic field; and extracting an end ring resonant mode signal from the volume coil.

3. A magnetic resonance method in which a magnetic field is generated along an axis through an examination region, radio frequency signals are transmitted into the examination region to induce magnetic resonance in nuclei of a desired object, and the induced magnetic resonance is received by a volume coil, the method further including:

matching a resonant frequency of an end ring resonant mode of the volume coil in which electrical current flows in end rings of the volume coil but not in rungs of the volume coil with a resonant frequency of at least one other resonant mode in which current flows at least in the rungs of the volume coil;

extracting an end ring resonant mode signal from the volume coil;

extracting a signal of the at least one other resonant mode; and reconstructing the end ring and other resonant mode signals into an image representation.

4. The method as set forth in claim 3, where the matching step comprises:

adjusting an effective reactance of at least one portion of the coil such that the end ring resonant mode signal and the other resonant mode signal occur at the common frequency.

5. The method as set forth in claim 3, wherein the extracting step comprises:

inductively coupling a conductor to the end ring resonant mode signal.

6. A magnetic resonance method in which a magnetic field is generated along an axis through a n examination region, radio frequency signals are transmitted into the examination region to induce magnetic resonance in nuclei of a desired object, the induced magnetic resonance is received by a volume coil and processed into an image representation, the method comprising:

positioning the volume coil within the examination region such that an axis of the coil is offset from the axis of the magnetic field;

adjusting a position of an inductively coupled loop with respect to the coil to match an end ring resonant mode and at least one other resonant mode of the volume coil to a common frequency;

extracting an end ring resonant mode signal and another resonant mode signal from the volume coil.

7. The method as set forth in claim 6, further comprising:

adjusting a reactance of the inductively coupled loop.

8. A method of magnetic resonance imaging in which a magnetic field is generated along an axis through an examination region comprising:

matching an end ring resonant mode from a volume coil having a pair of end rings disposed in parallel planes orthogonal to a longitudinal coil axis and two orthogonal resonant modes to a common frequency to produce a three axis coil;

positioning the three axis coil in the magnetic field with the longitudinal coil axis at an angle to the magnetic field axis;

inducing resonance at the common frequency such that resonance signals are generated;

picking up the resonance signals with the three axis coil in the end ring and the two other modes; and processing the picked up resonance signals in the end ring mode and the other modes, into an image representation.

9. A magnetic resonance apparatus comprising:

a main magnetic field generator for providing a main magnetic field along an axis;

a magnetic resonance excitor for exciting nuclei of an object to resonate, the nuclei generating magnetic resonance signals;

a volume coil including a pair of end rings separated along a coil axis, the end rings electrically interconnected by a plurality of rungs disposed about a periphery of the end rings; and, a conductive element inductively coupled to the end rings.

10. A magnetic resonance apparatus comprising:

a means for generating a main magnetic field along a main field axis;

a means for exciting nuclei of an object to resonate, the nuclei generating magnetic resonance signals;

a volume coil including a pair of end rings separated along a coil axis, the end rings electrically interconnected by a plurality of rungs;

an electrical conductor surrounding the rungs of the volume coil and positioned parallel to the end rings, the conductor being inductively coupled to the end rings; and a capacitive element in electrical communication with the conductor, the capacitive element selected to tune the loop and end rings to a selected resonance frequency.

11. The magnetic resonance apparatus as set forth in claim 10, wherein:
the conductive element is slidably disposed along the coil axis to adjust the selected frequency.

12. The magnetic resonance apparatus as set forth in claim 9, wherein the volume coil is tuned to receive signals of a common frequency in an end ring mode and in at least one of a sine mode and a cosine mode.

13. A magnetic resonance apparatus comprising:
a main magnetic field generator for providing a main magnetic field along a magnetic field axis;
a magnetic resonance excitor for exciting nuclei of an object to resonate, the resonating nuclei generating magnetic resonance signals;
a volume coil including a pair of end rings separated along a coil axis, the volume coil being disposed around the object with the coil axis offset from the main magnetic field axis; and
a conductive element inductively coupled to the end rings, for extracting end ring mode signals and supplying the extracted signals to a receiver.

14. A volume radio frequency (RF) coil for use in a magnetic resonance apparatus including a main magnetic field generator for providing a magnetic field along a $B_0$ axis, a radio frequency transmitter and a radio frequency receiver, at least one of the transmitter and the receiver being connected with the RF coil; the RF coil comprising:
a pair of conductive end rings disposed concentrically about a coil axis on displaced parallel planes;
a plurality of conductive rungs being disposed about a periphery of the end rings and providing electrical interconnection therebetween; and
an electrically conductive loop inductively coupled to the pair of end rings, the electrically conductive loop being connected with the receiver for supplying end ring mode resonance signals thereto.

15. The volume RF coil as set forth in claim 14, further comprising:
a first sampling port in electrical communication with the loop which samples a first resonant mode directed along the coil axis.

16. The volume RF coil as set forth in claim 15, further comprising:
a second sampling port in electrical communication with the end rings which samples a second resonant mode orthogonal to the coil axis, such that the RF coil operates as a quadrature coil.

17. The volume RF coil as set forth in claim 16, further comprising:
a third sampling port in electrical communication with an end ring, the second and third sampling ports sampling sine and cosine modes directed orthogonal to the coil axis.

18. A volume RF coil comprising:
a pair of conductive end rings disposed concentrically about a coil axis on displaced parallel planes;
a plurality of conductive rungs being disposed about a periphery of the end rings and providing RF electrical interconnection therebetween; and
an electrically conductive loop inductively coupled to the pair of end rings, the loop being slidably disposed along the coil axis to adjust inductive coupling with the end rings.

19. The volume RF coil as set forth in claim 14, wherein the end rings are circular and of common radius which common radius is substantially equal to a displacement between the end rings.

20. A vertical field magnetic resonance apparatus comprising:
a main field magnet which generates a vertically oriented $B_0$ field through an examination region;
a means for exciting and spatially encoding magnetic resonance in a subject in the examination region;
a horizontally oriented birdcage coil disposed in the examination region around the subject, the birdcage coil including a pair of end rings separated along a horizontal coil axis, the end rings electrically interconnected by a plurality of rungs disposed parallel to and surrounding the horizontal coil axis;
a conductive ring inductively coupled to the end rings and connected to a receiver for conducting magnetic resonance signals picked up by the horizontal birdcage coil to the receiver for demodulation; and,
a reconstruction processor for reconstructing the demodulated magnetic resonance signals into an image representation.

21. An RF coil for magnetic resonance imaging including:
a Helmholtz coil pair arranged to generate or detect a first magnetic field at a first resonance frequency, the first magnetic field being aligned along an axial direction perpendicular to the coils of the Helmholtz coil pair;
a plurality of electrically interconnected rungs disposed between the coils of the Helmholtz coil pair to generate or detect at least a second magnetic field at a second resonance frequency, the second magnetic field being aligned in a plane perpendicular to the axial direction; and
a tuning coil arranged perpendicular to the axial direction and disposed between the coils of the Helmholtz coil pair, the tuning coil inductively cooperating with the Helmholtz coil pair to tune the first resonance frequency to equal the second resonance frequency.

22. The RF coil for magnetic resonance imaging as set forth in claim 21, wherein the Helmholtz coil pair mechanically connects with the rungs.

23. The RF coil for magnetic resonance imaging as set forth in claim 21, wherein the Helmholtz coil pair electrically contacts ends of the rungs to effectuate the electrical interconnection of the rungs.

24. The RF coil for magnetic resonance imaging as set forth in claim 21, wherein each coil of the Helmholtz coil pair includes a single conductive loop.

25. The RF coil for magnetic resonance imaging as set forth in claim 21, wherein the Helmholtz coil pair and the plurality of rungs are interconnected to define a birdcage coil.

* * * * *